United States Patent
Tsai

(10) Patent No.: US 11,809,243 B2
(45) Date of Patent: Nov. 7, 2023

(54) HEAT EXCHANGE MODULE AND SERIAL PUMP THEREOF

(71) Applicant: COOLER MASTER CO., LTD., New Taipei (TW)

(72) Inventor: Shui-Fa Tsai, New Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 232 days.

(21) Appl. No.: 17/307,614

(22) Filed: May 4, 2021

(65) Prior Publication Data

US 2021/0255676 A1    Aug. 19, 2021

Related U.S. Application Data

(63) Continuation of application No. 16/222,345, filed on Dec. 17, 2018, now Pat. No. 11,029,738, which is a
(Continued)

(30) Foreign Application Priority Data

Jan. 27, 2016    (CN) .......................... 201610055067.4

(51) Int. Cl.
*G06F 1/20*     (2006.01)
*H05K 7/20*    (2006.01)
(Continued)

(52) U.S. Cl.
CPC ................. *G06F 1/20* (2013.01); *F04D 1/06* (2013.01); *H05K 7/20272* (2013.01);
(Continued)

(58) Field of Classification Search
CPC .. G06F 1/20; F04D 1/06; F04D 1/003; H05K 7/20272; H05K 7/20327; H01L 23/473
(Continued)

(56) References Cited

U.S. PATENT DOCUMENTS 6,804,115 B2    10/2004  Lai
7,222,661 B2     5/2007  Wei et al.
(Continued)

OTHER PUBLICATIONS

Notice of Allowance issued in U.S. Appl. No. 15/283,299, dated Sep. 24, 2018.
(Continued)

*Primary Examiner* — Joel M Attey
(74) *Attorney, Agent, or Firm* — McDermott Will & Emery LLP

(57) ABSTRACT

A serial pump includes a pump body, a first impeller and a second impeller. A first rotor chamber, a second rotor chamber and a connecting channel are formed in the pump body. The first rotor chamber has a first outlet opening, the second rotor chamber has a second inlet opening, and the connecting channel is communicated between the first outlet opening and the second inlet opening. The first impeller is pivotally arranged in the first rotor chamber, and an outer periphery of the first impeller is arranged corresponding to the first outlet opening. The second impeller is pivotally arranged in the second rotor chamber, and a center of the second impeller is arranged corresponding to the second inlet opening. Accordingly, the first impeller and the second impeller are serially arranged.

17 Claims, 20 Drawing Sheets

Related U.S. Application Data continuation of application No. 15/283,299, filed on Oct. 1, 2016, now Pat. No. 10,198,046.

(51) Int. Cl.
  *F04D 1/06* (2006.01)
  *H01L 23/473* (2006.01)
  *F04D 13/14* (2006.01)
  *F04D 1/00* (2006.01)

(52) U.S. Cl.
  CPC .............. *F04D 1/003* (2013.01); *F04D 13/14* (2013.01); *G06F 2200/201* (2013.01); *H01L 23/473* (2013.01); *H05K 7/20327* (2013.01)

(58) Field of Classification Search
  USPC .............. 165/104.31, 104.33, 80.4; 361/699; 415/60, 61; 417/286, 423.5, 426
  See application file for complete search history.

(56) References Cited

U.S. PATENT DOCUMENTS

| | | |
|---|---|---|
| 2013/0120935 A1 | 5/2013 | Huang |
| 2014/0069614 A1* | 3/2014 | Chiu .................... H01L 23/473 165/104.19 |

OTHER PUBLICATIONS

Notice of Allowance issued in U.S. Appl. No. 16/222,345, dated Feb. 4, 2021.

* cited by examiner

HEAT EXCHANGE MODULE AND SERIAL PUMP THEREOF

CROSS-REFERENCE TO RELATED APPLICATIONS

This non-provisional application is a continuation of U.S. patent application Ser. No. 16/222,345 filed Dec. 17, 2018, which is a continuation of and claims priority under 35 U.S.C. § 120 to U.S. patent application Ser. No. 15/283,299 filed Oct. 1, 2016, now U.S. Pat. No. 10,198,046, which claims priority under 35 U.S.C. § 119 to Chinese patent application No. 201610055067.4 filed Jan. 27, 2016, in the National Intellectual Property Administration of the People's Republic of China (PRC), the entire contents of all these applications are incorporated herein by reference in their entirety.

BACKGROUND

Technical Field

The present disclosure is related to a pump, particularly a heat exchange module having serial rotors and a serial pump thereof.

Description of Related Art

For some current computers capable of high performance, a fan driven by a gas cooling system is not sufficient to provide adequate cooling, and a liquid cooling system is further required. A liquid cooling loop includes a heat conductive block and a pump. Heat is removed from a heat source via the heat conductive block, and a working fluid is driven by the pump to flow in the cooling loop, so heat is removed while the working fluid flows through the heat conductive block.

A conventional liquid cooling system is physically large. As such, a design of a combination of the pump and the heat conductive block has been developed so that the volume of cooling system is decreased. However, there is limited space available on the heat conductive block, and it is difficult to install a large pump thereon, so a high head requirement is not easy to meet.

In view of the foregoing, in order to address the above-noted issues, the present inventor studies related technology and provides a reasonable and effective solution in the present disclosure.

SUMMARY

A heat exchange module having serial rotors and a serial pump thereof are provided in the present disclosure.

In one aspect, a serial pump including a pump body, a first impeller and a second impeller is provided in the present disclosure. A first rotor chamber, a second rotor chamber and a connecting channel are formed in the pump body, the first rotor chamber includes a first inlet opening and a first outlet opening, the second rotor chamber includes a second inlet opening and a second outlet opening, and the connecting channel is communicated between the first outlet opening and the second inlet opening. The first impeller is pivotally arranged in the first rotor chamber, and an outer periphery of the first impeller is arranged corresponding to the first outlet opening. The second impeller is pivotally arranged in the second rotor chamber, and a center of the second impeller is arranged corresponding to the second inlet opening.

In the present disclosure, the first rotor chamber includes a first inlet opening and a first outlet opening, and a center of the first impeller is arranged corresponding to the first inlet opening. A collection tank is formed in the pump body, and the collection tank is communicated with the first inlet opening. A pumping hole communicated with the collection tank is defined in the pump body. The second rotor chamber includes a second inlet opening and a second outlet opening, and an outer periphery of the second impeller is arranged corresponding to the second outlet opening. A drainage tank is formed in the pump body, and the drainage tank is communicated with the second outlet opening. A drainage hole communicated with the drainage tank is defined in the pump body. The second impeller and the first impeller are arranged coplanar with each other. A partition plate is arranged in the pump body, the partition plate includes a first case and a second case, a first rotor chamber is formed in the first case, and a second rotor chamber is formed in the second case. The partition plate includes at least a wall. The wall divides the pump body into the collection tank and the drainage tank, and the collector tank and drainage tank are isolated from each other. The connecting channel is defined in the pump body by the partition plate.

In another aspect, a heat exchange module including a pump body, a heat conductive block, a first impeller and a second impeller is further provided in the present disclosure. A first rotor chamber, a second rotor chamber and a connecting channel are formed in the pump body, the first rotor chamber includes a first inlet opening and a first outlet opening, the second rotor chamber includes a second inlet opening and a second outlet opening, and the connecting channel is communicated between the first outlet opening and the second inlet opening. A heat convection chamber is formed on the heat conductive block, and the heat convection chamber is communicated with the pump body. The first impeller is pivotally arranged in the first rotor chamber, and an outer periphery of the first impeller is arranged corresponding to the first outlet opening. The second impeller is pivotally arranged in the second rotor chamber, and a center of the second impeller is arranged corresponding to the second inlet opening.

In the present disclosure, the first rotor chamber includes a first inlet opening, and a center of the first impeller is arranged corresponding to the first inlet opening. The heat convection chamber is communicated with the first inlet opening. A collection tank is formed in the pump body, and the collection tank is communicated with the first inlet opening. A pumping hole communicated with the collection tank is defined in the pump body. The heat convection chamber is communicated with the collection tank, and the heat convection chamber includes a pumping hole. The second rotor chamber includes a second outlet opening, and an outer periphery of the second impeller is arranged corresponding to the second outlet opening. The heat convection chamber is communicated with the second outlet opening. A drainage tank is formed in the pump body, and the drainage tank is communicated with the second outlet opening. A drainage hole communicated with the drainage tank is defined in the pump body. The heat convection chamber is communicated with the drainage tank, and the heat convection chamber includes a drainage hole. The heat convection chamber is communicated with the connecting channel. The connecting channel includes an inlet segment and an outlet segment, the inlet segment is communicated between the first rotor chamber and the heat convection chamber, and the outlet segment is communicated between the heat convection chamber and the second rotor chamber.

The second impeller and the first impeller are arranged coplanar with each other. A partition plate is arranged in the pump body, the partition plate includes a first case and a second case, the first rotor chamber is formed in the first case, and the second rotor chamber is formed in the second case. The partition plate includes at least a wall, and the wall divides the pump body into the collection tank and the drainage tank, and the collector tank and the drainage tank are isolated from each other. The connecting channel is defined in the pump body by the partition plate.

According to the heat exchange module and the serial pump thereof in the present disclosure, the first impeller and the second impeller are serially arranged to pressurize the flowing working fluid, and flow of the working fluid is thereby increased. A serial flowing field is formed in a plane via the connecting channel, thickness of the serial pump is therefore decreased, and space utilization thereof improved.

BRIEF DESCRIPTION OF THE DRAWINGS

The present disclosure can be more fully understood by reading the following detailed description of the embodiments, with reference made to the accompanying drawings as follows.

DETAILED DESCRIPTION

Figure 1:
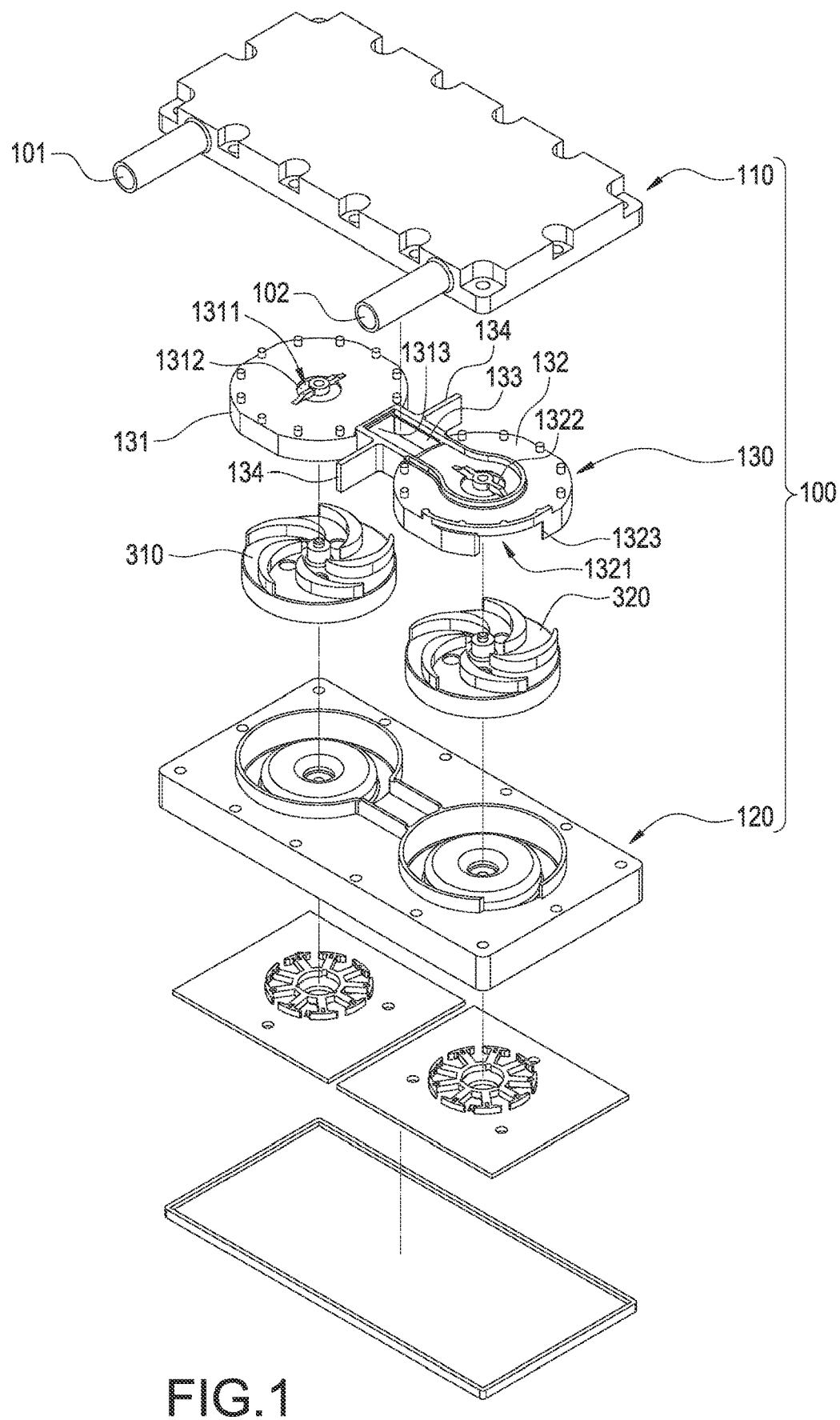
FIG. 1 is an exploded view showing the serial pump of a first embodiment of the present disclosure.
Figure 2:
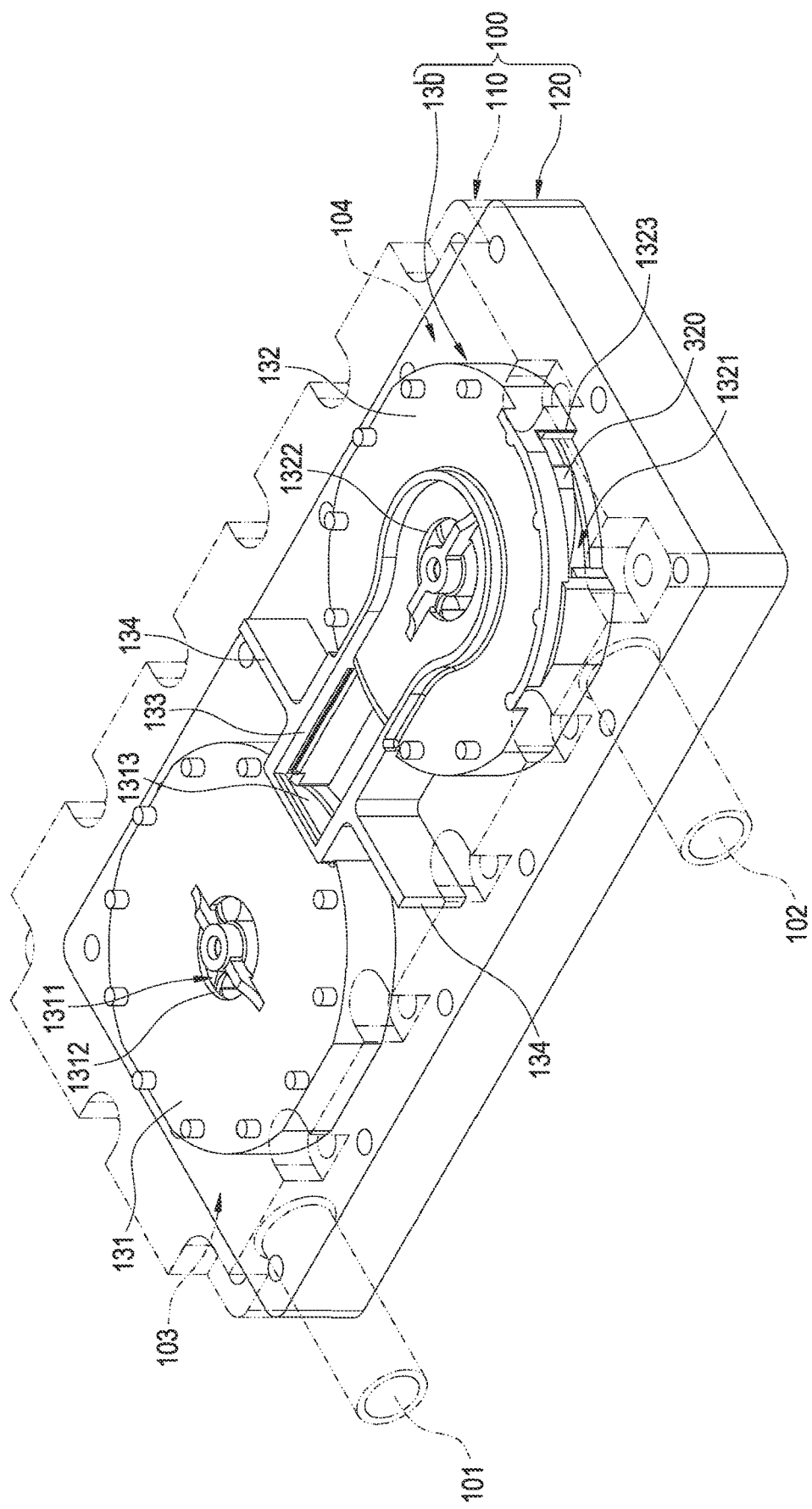
FIG. 2 is a perspective view showing the serial pump of the first embodiment of the present disclosure.
Figure 3:
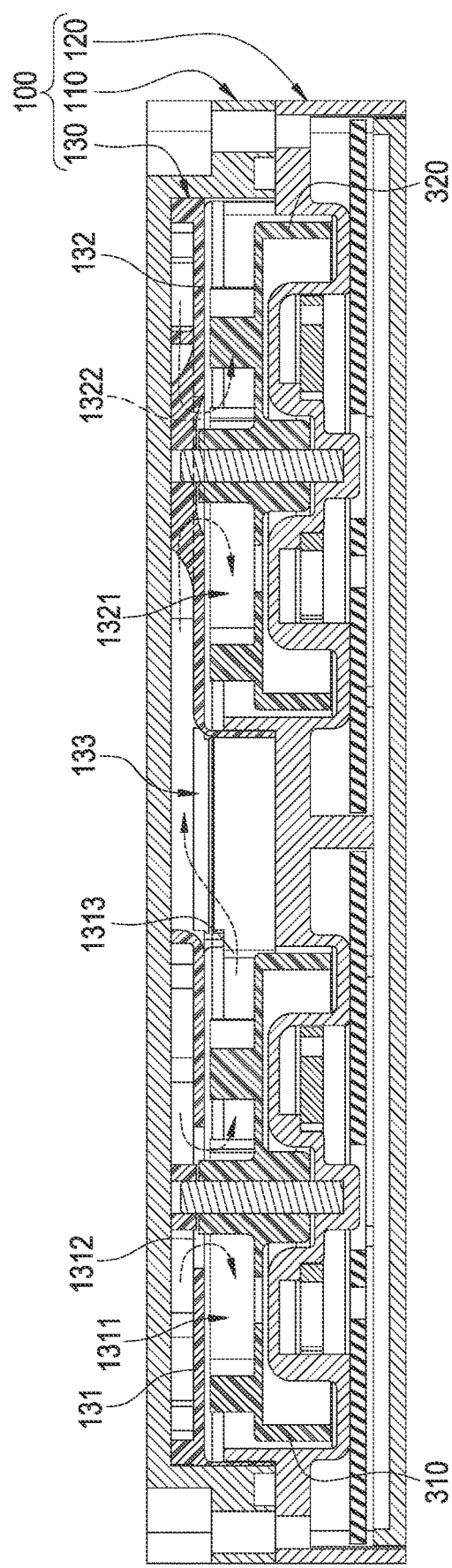
FIGS. 3 to 5 are schematic diagrams showing working status of the serial pump of the first embodiment of the present disclosure.
Figure 4:
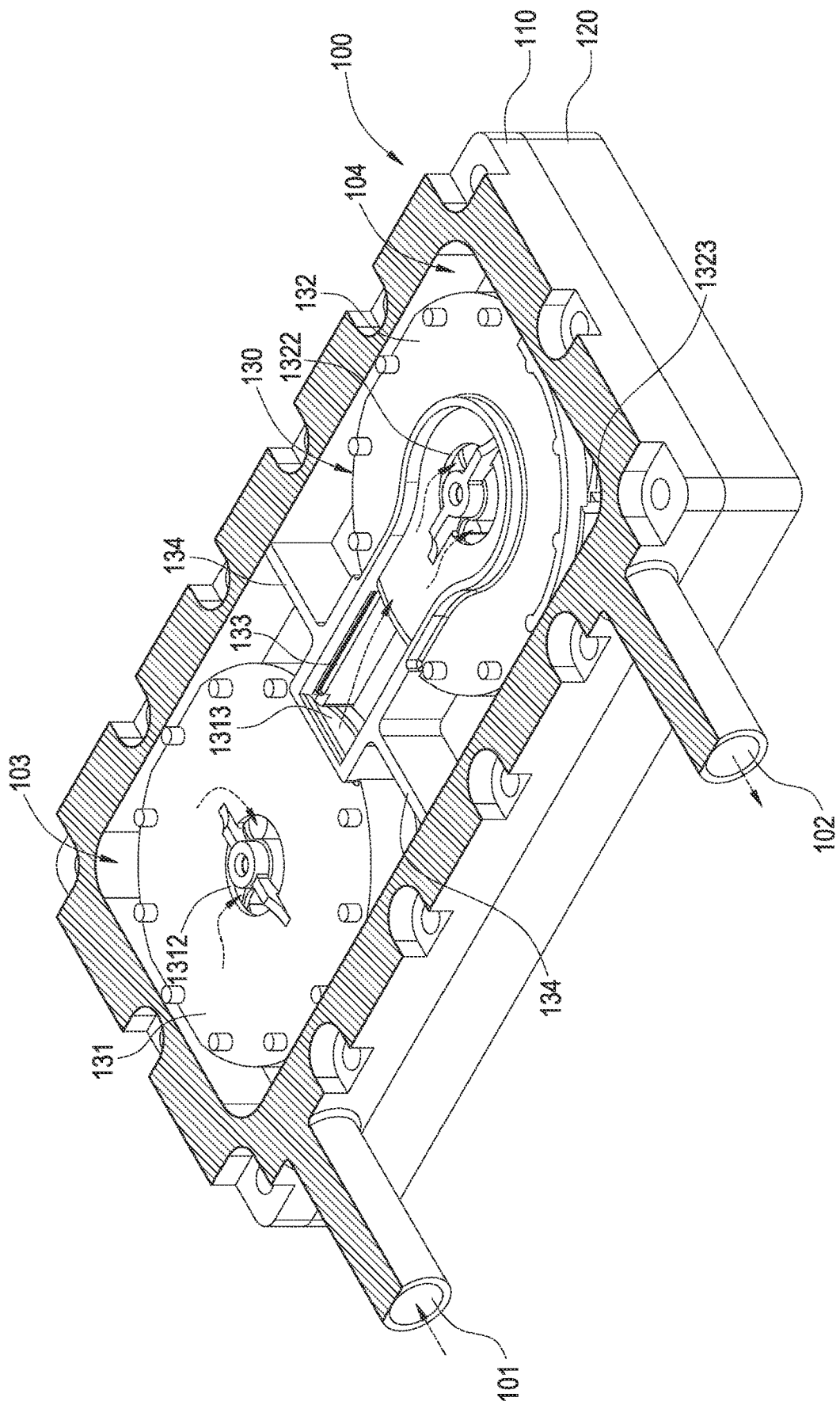
Figure 5:
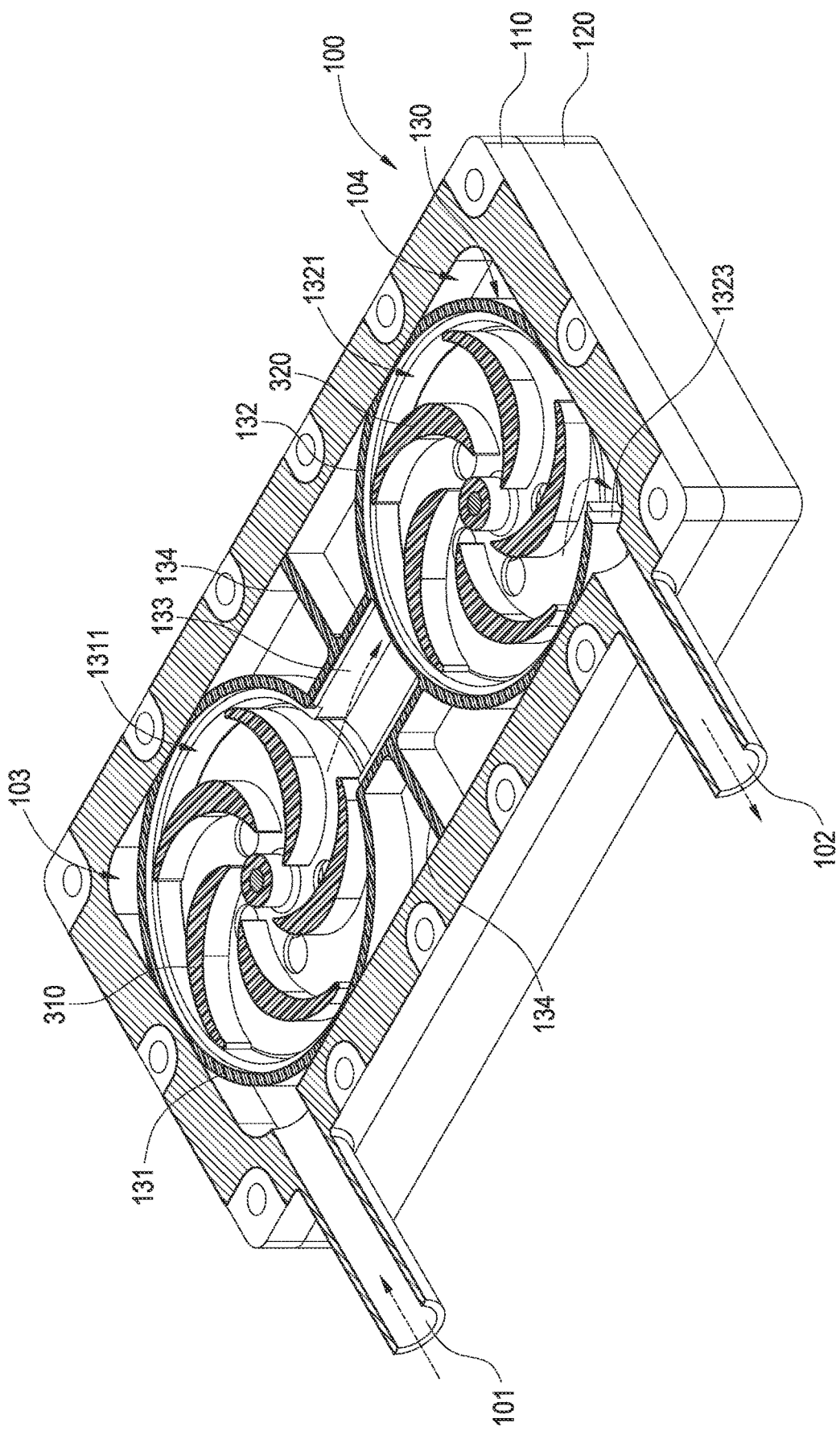

Please refer to FIGS. 1 and 2. A serial pump including a pump body 100, a first impeller 310 and a second impeller 320 is provided in the first embodiment of the present disclosure.

In the present embodiment, the pump body 100 preferably includes an upper cover 110, a base 120 and a partition plate 130. The upper cover 110 and the base 120 are sleeved with each other and thereby sealed with each other, a pumping hole 101 and a drainage hole 102 are defined on the upper cover 110, and a partition plate 130 is stacked between the upper cover 110 and the base 120. The partition plate 130 has at least a wall 134, a first case 131 and a second case 132. The wall 134 divides the pump body 100 into a collection tank 103 and a drainage tank 104 isolated from each other between the upper cover 110 and the base 120, the collection tank 103 is communicated with the pumping hole 101, and the drainage tank 104 is communicated with the drainage hole 102. The first case 131 is located in the collection tank 103, the first case 131 covers an internal wall of the base 120 and a first rotor chamber 1311 is thereby defined in the first case 131, a first inlet opening 1312 and a first outlet opening 1313 are defined on the first case 131, and the collection tank 103 is communicated with the first rotor chamber 1311 via the first inlet opening 1312. The second case 132 is located in the drainage tank 104, the second case 132 covers the internal wall of the base 120, a second rotor chamber 1321 is thereby defined in the second case 132, a second inlet opening 1322 and a second outlet opening 1323 are defined on the second case 132, and the drainage tank 104 and the second rotor chamber 1321 are communicated with each other via the second outlet opening 1323. A connecting channel 133 is defined between the upper cover 110 and the base 120 by the partition plate 130, two ends of the connecting channel 133 are respectively communicated with the first outlet opening 1313 and the second inlet opening 1322, and the first rotor chamber 1311 and the second rotor chamber 1321 are communicated with each other via the connecting channel 133.

The first impeller 310 is pivotally arranged on the base 120 and thereby located in the first rotor chamber 1311, a center of the first impeller 310 is arranged corresponding to the first inlet opening 1312, and a peripheral of the first impeller 310 is arranged corresponding to the first outlet opening 1313.

The second impeller 320 is pivotally arranged on the base 120 and thereby located in the 15 second rotor chamber 1321, the second impeller 320 and the first impeller 310 are arranged coplanar with each other, a center of the second impeller 320 is arranged corresponding to the second inlet opening 1322, and a peripheral of the second impeller 320 is arranged corresponding to the second outlet opening 1323.

Referring to FIGS. 2 to 5, a pressure difference is caused between the first inlet opening 1312 and the first outlet opening 1313 while the first impeller 310 is rotating, and working fluid is thereby pumped into the first rotor chamber 1311 through the first inlet opening 1312 and further drained from the first rotor chamber 1311 through the first outlet opening 1313. Then, the working fluid further flows into the connecting channel 133 through the first outlet opening 1313, and the working fluid flows into the second inlet opening 1322 through the connecting channel 133. A pressure difference is caused between the second inlet opening 1322 and the second outlet opening 1323 while the second impeller 320 is rotating, and the working fluid is thereby pumped into the second rotor chamber 1321 through the second inlet opening 1322 and further drained from the second rotor chamber 1321 through the second outlet opening 1323.

According to aforementioned serial configuration of the first impeller 310 and the second impeller 320, the working fluid is driven to flow by the first impeller 310 and pressurized by the second impeller 320 to increase flowing head thereof. The first impeller 310 and the second impeller 320 are arranged coplanar with each other and serial connected via the connecting channel 133 to form a serial flowing field in the plane, thickness of the serial pump is thereby decreased, and space utilization thereof is increased while installing the serial pump.

While the serial pump of the present embodiment is working, the collection tank 103 is used for draining the working fluid into the serial pump through at least a pumping hole 101 and collecting the working fluid therein to inject into the first rotor chamber 1311, and flux is thereby increased. Otherwise, the drainage tank 104 is used for draining the working fluid into at least a drainage hole 102. Therefore, the serial pump of the present embodiment could be used to drive multiple working fluid loops arranged in parallel. However, the scope of the present disclosure should not be limited by the embodiment, and the collection tank 103 is unnecessary in the pump body 100 for a single working fluid loop. Rather than the first inlet opening 1312 of the first rotor chamber 1311, single pumping hole 101 communicated with the first rotor chamber 1311 is correspondingly defined in the pump body 100 to supply the working fluid into the first rotor chamber 1311. Correspondingly, rather than the drainage tank 104 in the pump body 100 and the second outlet opening 1323 of the second rotor chamber 1321, single drainage hole 102 communicated with the second rotor chamber 1321 is defined in the pump body 100 for drainage.

Figure 6:
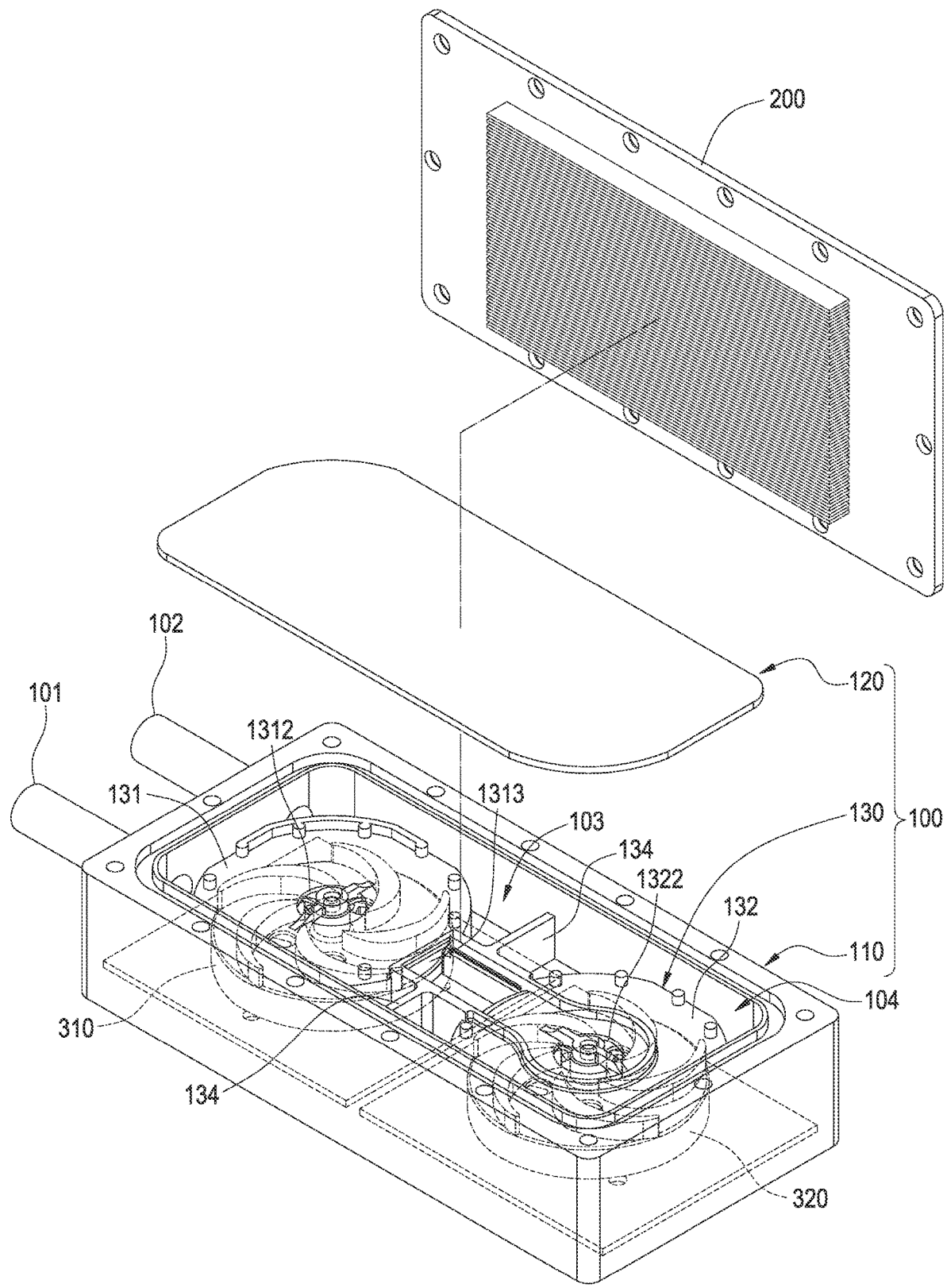
FIG. 6 is an exploded view showing the heat exchange module of a second embodiment of the present disclosure.
Figure 7:
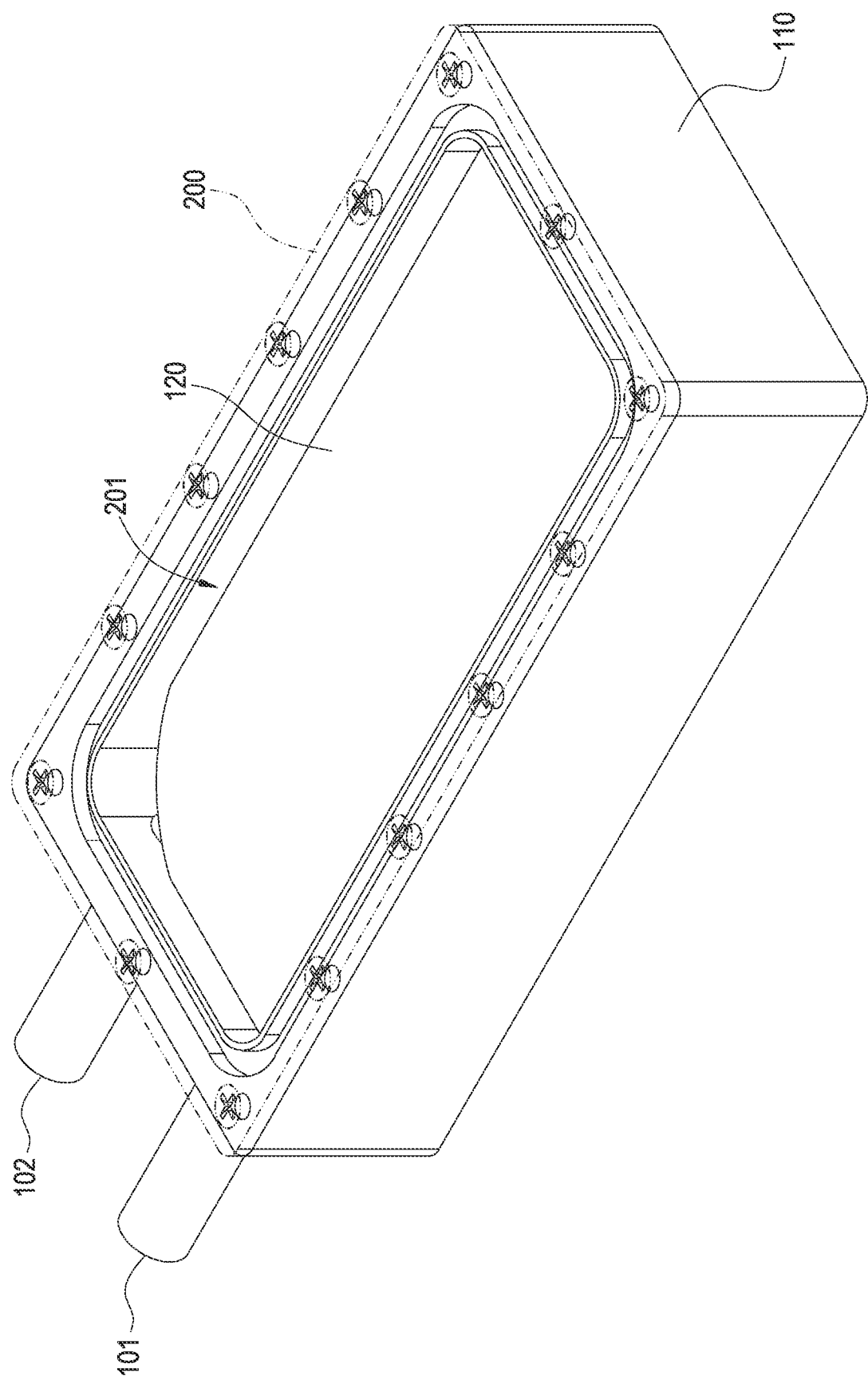
FIG. 7 is a perspective view showing the heat exchange module of the second embodiment of the present disclosure.

Referring to FIGS. 6 and 7, a heat exchange module including a pump body 100, a heat conductive block 200, a first impeller 310 and a second impeller 320 is provided in the second embodiment of the present disclosure.

In the present embodiment, the pump body 100 preferably includes an upper cover 110, a base 120 and a partition plate 130. The upper cover 110 covers the base 120, a pumping hole 101 and a drainage hole 102 are defined on the upper cover 110, the partition plate 130 is stacked between the upper cover 110 and the base 120, and the partition plate 130 includes at least a wall 134, a first case 131 and a second case 132. The wall 134 divides the pump body 100 into an isolated collection tank 103, and the collection tank 103 is communicated with the pumping hole 101; the first case 131 is located in the collection tank 103, the first case 131 covers on an internal wall of the base 120 and a first rotor chamber 1311 is thereby defined in the first case 131, a first inlet opening 1312 and a first outlet opening 1313 are defined in the first case 131, and the collection tank 103 and the first rotor chamber 1311 are communicated with each other via the first inlet opening 1312. The second case 132 covers on the internal wall of the base 120 and a second rotor chamber 1321 is thereby defined in the second case 132, a second inlet opening 1322 and a second outlet opening 1323 are defined in the second case 132. A part of the wall 134 is connected between the first case 131 and second case 132, a connecting channel 133 is thereby defined between the upper cover 110 and the base 120, two ends of the connecting channel 133 are respectively communicated with the first outlet opening 1313 and the second inlet opening 1322, and the first rotor chamber 1311 and the second rotor chamber 1321 are communicated with each other via the connecting channel 133.

In the present embodiment, the upper cover 110 further covers the heat conductive block 200, the upper cover 110 is sealed with the heat conductive block 200, and a heat convection chamber 201 is defined between the heat conductive block 200 and the base 120. In the present embodiment, preferably, the heat convection chamber 201 is respectively communicated with the second outlet opening 1323 and the drainage hole 102 through a gap between the upper cover 110 and the base 120.

The first impeller 310 is pivotally arranged in the upper cover 110 and therefore located in the first rotor chamber 1311, a center of the first impeller 310 is arranged corresponding to the first inlet opening 1312, and a peripheral of the first impeller 310 is arranged corresponding to the first outlet opening 1313.

The second impeller 320 is pivotally arranged in the upper cover 110 and therefore located in the second rotor chamber 1321, and the second impeller 320 and the first impeller 310 are arranged coplanar with each other. A center of the second impeller 320 is arranged corresponding to the second inlet opening 1322, and a peripheral of the second impeller 320 is arranged corresponding to the second outlet opening 1323.

Figure 8:
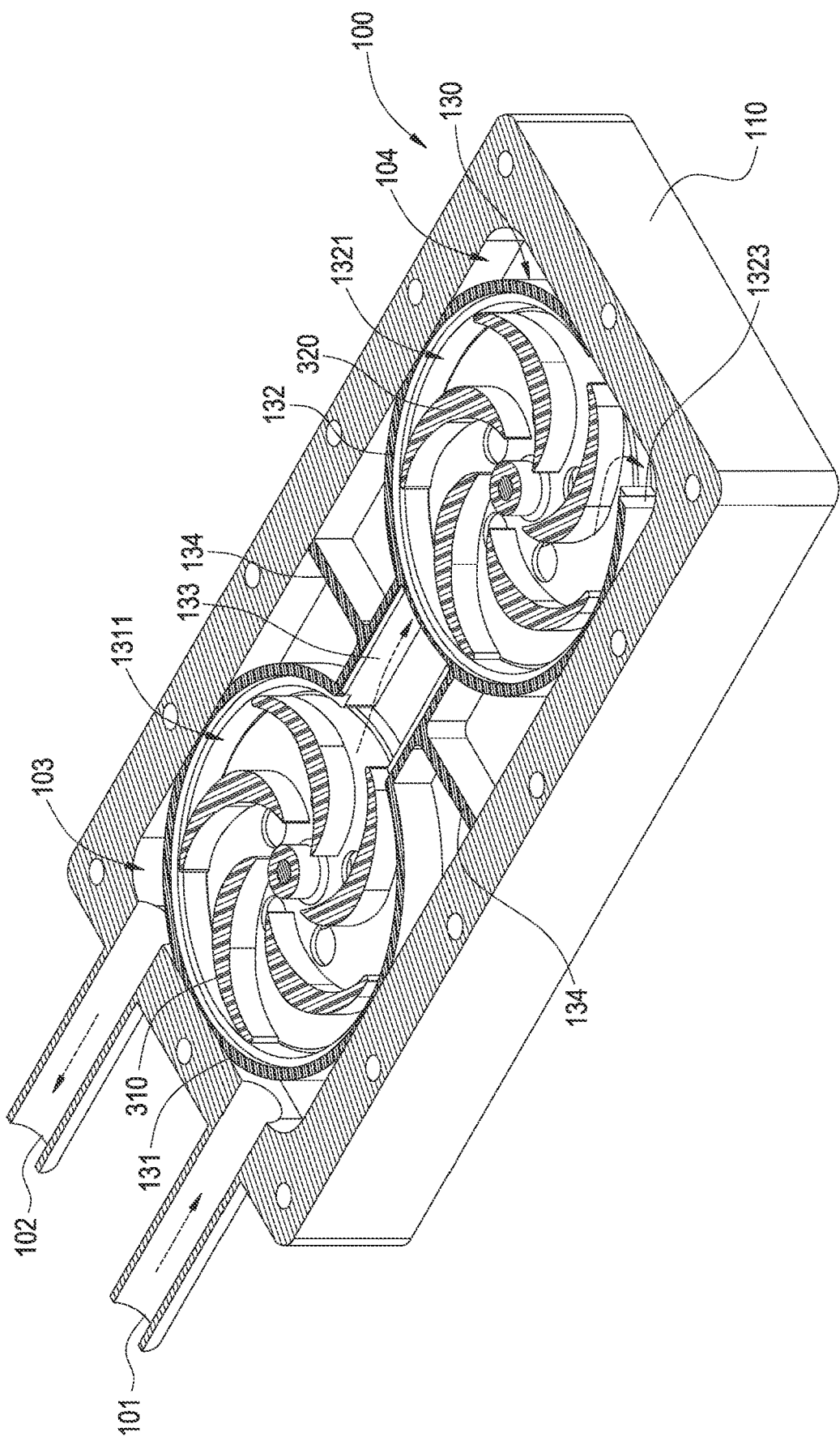
FIGS. 8 to 10 are schematic diagrams showing working status of the heat exchange module of the second embodiment of the present disclosure.
Figure 9:
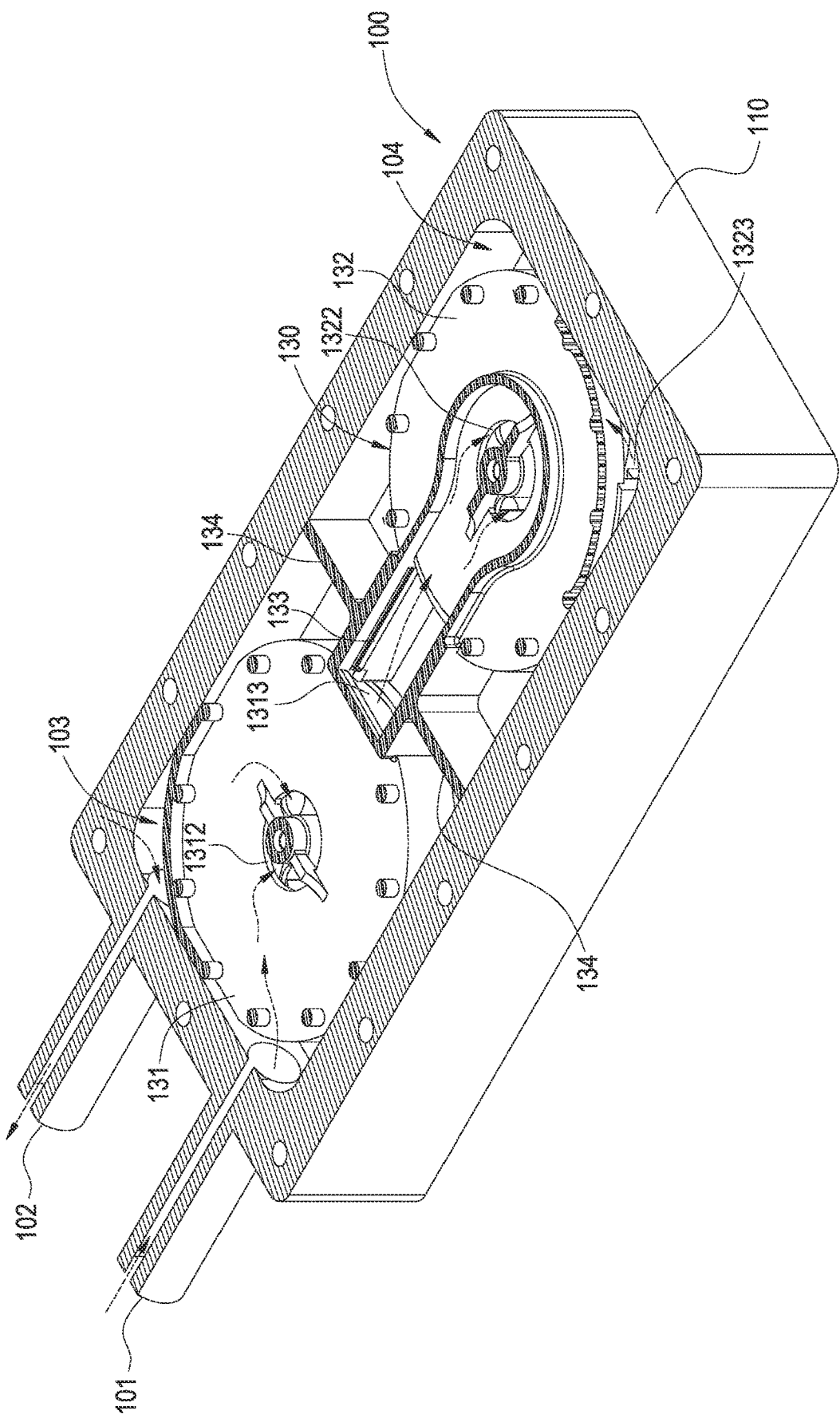
Figure 10:
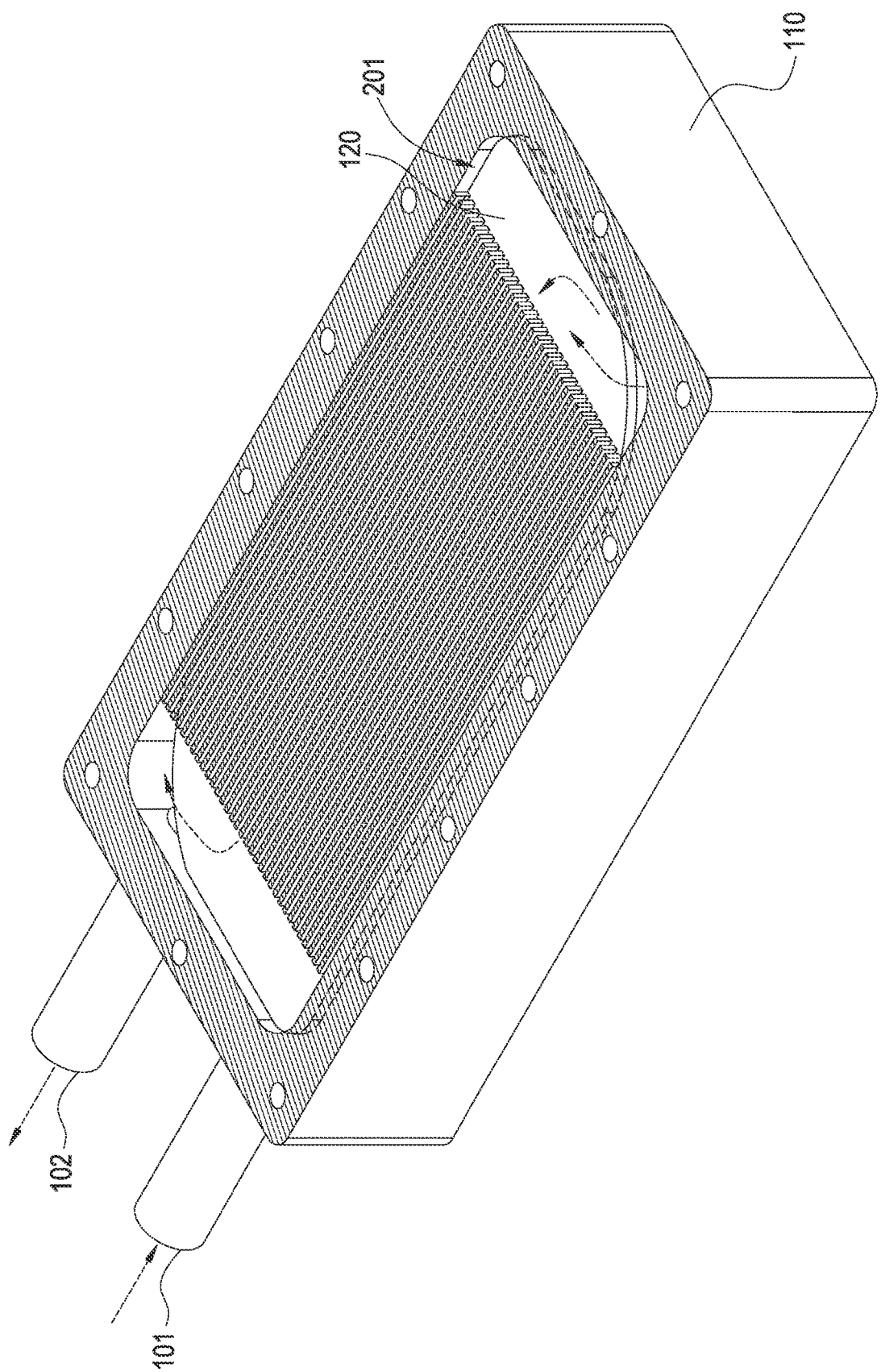

Referring to FIGS. 8 to 10, a pressure difference is caused between the first inlet opening 1312 and the first outlet opening 1313 while the first impeller 310 is rotating, the working fluid is thereby driven to flow into the first rotor chamber 1311 through the first inlet opening 1312 and further drained from the first rotor chamber 1311 through the first outlet opening 1313. Then, the working fluid further flows into the connecting channel 133 through the first outlet opening 1313 and flows into the second inlet opening 1322 via the connecting channel 133. A pressure difference is caused between the second inlet opening 1322 and the second outlet opening 1323 while the second impeller 320 is rotating, and the working fluid is thereby driven to flow into the second rotor chamber 1321 through the second inlet opening 1322 and further drained into the heat convection chamber 201 from the second rotor chamber 1321 through the second outlet opening the 1323. The heat conductive block 200 is used for contacting with a heat source to remove heat therefrom, and the working fluid in the heat convection chamber 201 exchanges heat with the heat conductive block 200 to remove heat from the heat conductive block 200. While the working fluid flows out from the heat exchange module through the drainage hole 102, heat is thereby removed from the heat exchange module.

According to aforementioned serial configuration of the first impeller 310 and the second impeller 320, the working fluid is driven to flow by the first impeller 310 and pressurized by the second impeller 320, and flowing head of the flowing working fluid is thereby increased. The first impeller 310 and the second impeller 320 are arranged coplanar with each other and connected by the connecting channel 133, a serial flowing field is thereby formed in the plane, thickness of the heat exchange module is thereby decreased, and space utilization thereof is increased while installing the serial pump.

Figure 11:
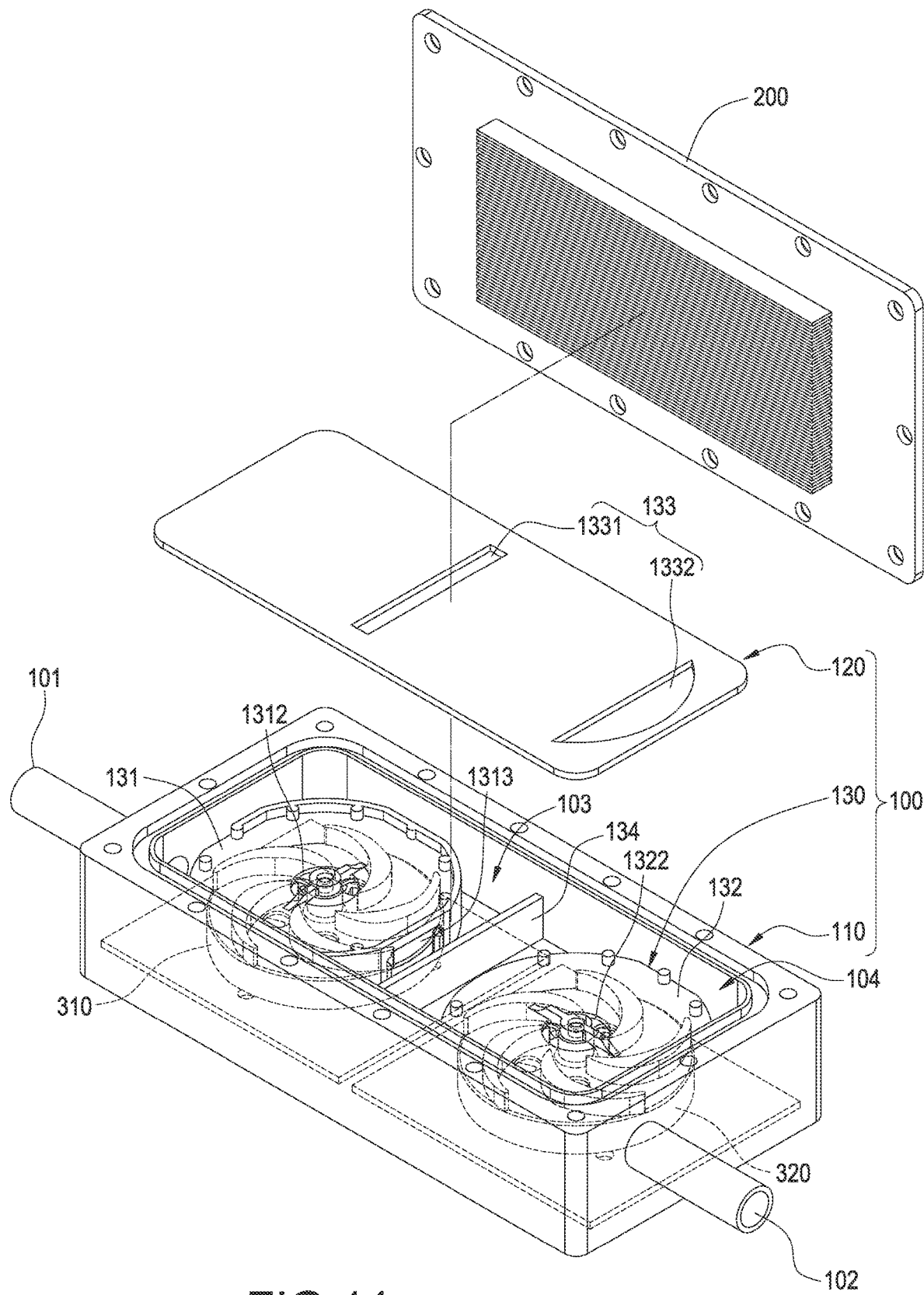
FIG. 11 is an exploded view showing the heat exchange module of a third embodiment of the present disclosure.
Figure 12:
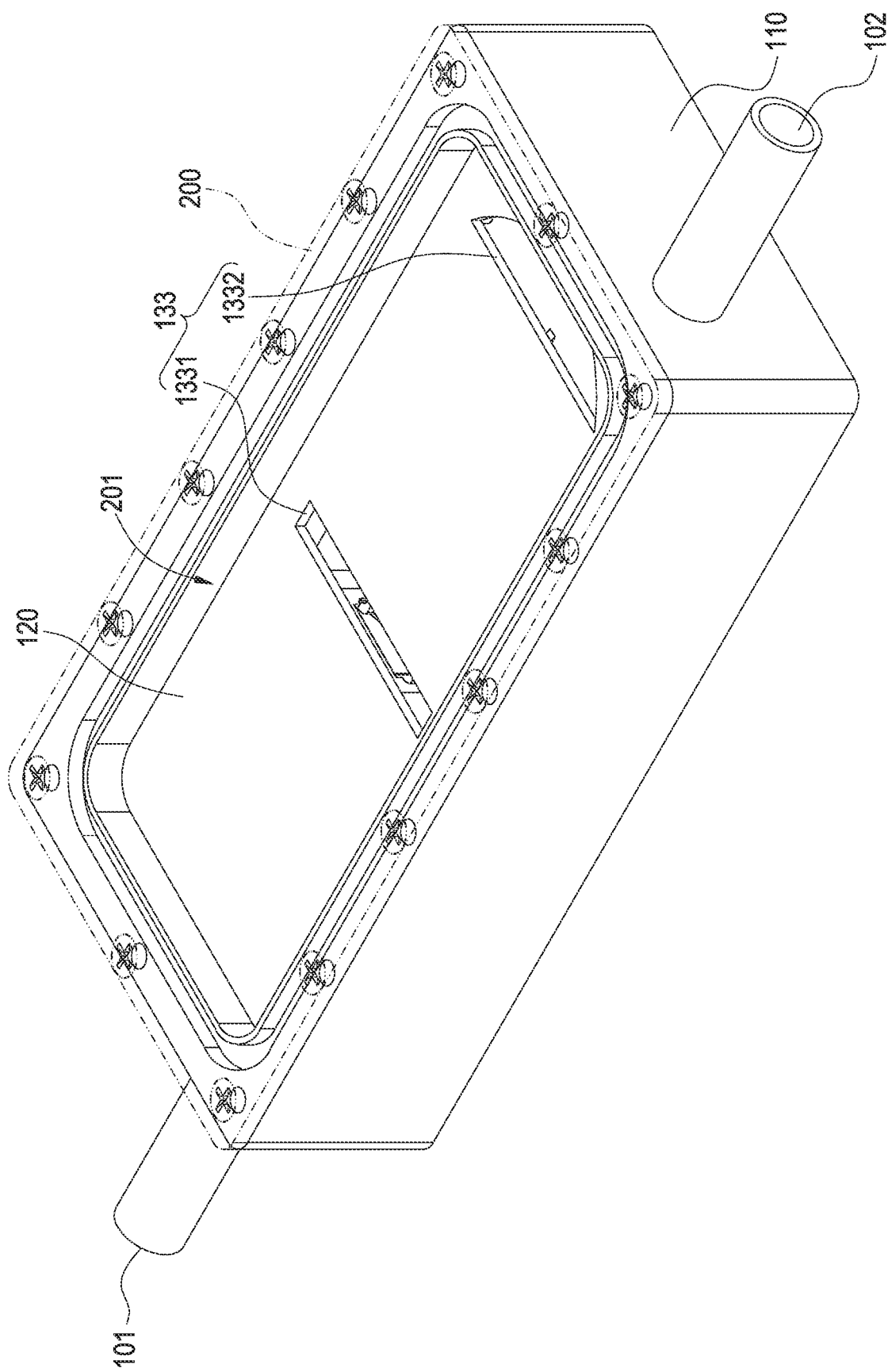
FIG. 12 is a perspective view showing the heat exchange module of the third embodiment of the present disclosure.

Referring to FIGS. 11 and 12, a heat exchange module including a pump body 100, a heat conductive block 200, a first impeller 310 and a second impeller 320 is provided in the third embodiment of the present disclosure.

In the present embodiment, the pump body 100 preferably includes an upper cover 110, a base 120 and a partition plate 130. The upper cover 110 and base 120 are sleeved with each other and thereby sealed with each other, a pumping hole 101 and a drainage hole 102 are defined on the upper cover 110, the upper cover 110 has at least a wall 134, the partition plate 130 is stacked between the upper cover 110 and the base 120, and the partition plate 130 has a first case 131 and a second case 132. The wall divides the pump body 100 into a collection tank 103 and a drainage tank 104, the collection tank 103 and the drainage tank 104 are isolated from each other, and the collection tank 103 is communicated with the pumping hole 101; the first case 131 is located in the collection tank 103, the first case 131 covers an internal wall of the base 120 and a first rotor chamber 1311 is thereby defined in the first case 131, a first inlet opening 1312 and a first outlet opening 1313 are defined on the first case 131, and the collection tank 103 and the first rotor chamber 1311 are communicated with each other via the first inlet opening 1312; the second case 132 is located in the drainage tank 104, the second case 132 covers an internal wall of the base 120 and a second rotor chamber 1321 is thereby defined in the second case 132, a second inlet opening 1322 and a second outlet opening 1323 are defined on the second case 132, and the drainage tank 104 and the second rotor chamber 1321 are communicated with each other via the second outlet opening 1323; a connecting channel 133 is formed on the base 120, an inlet segment 1331 and an outlet segment 1332 are separately formed at respective ends of the connecting channel 133, the inlet segment 1331 is communicated with the first outlet opening 1313, the outlet segment 1332 is communicated with the second inlet opening 1322, and the first rotor chamber 1311 and the second rotor chamber 1321 are communicated with each other by the connecting channel 133.

A heat convection chamber 201 is defined between heat conductive block 200 and the base 120; the heat convection chamber 201 is communicated between the inlet segment 1331 and the outlet segment 1332 of the connecting channel 133.

The first impeller 310 is pivotally arranged in the upper cover 110 and therefore located in the first rotor chamber 1311, a center of the first impeller 310 is arranged corresponding to the first inlet opening 1312, and a peripheral of the first impeller 310 is arranged corresponding to the first outlet opening 1313.

The second impeller 320 is pivotally arranged in the upper cover 110 and therefore located in the second rotor chamber 1321, the second impeller 320 and the first impeller 310 are arranged coplanar with each other, a center of the second impeller 320 is arranged corresponding to the second inlet opening 1322, and a peripheral of the second impeller 320 is arranged corresponding to the second outlet opening 1323.

Figure 13:
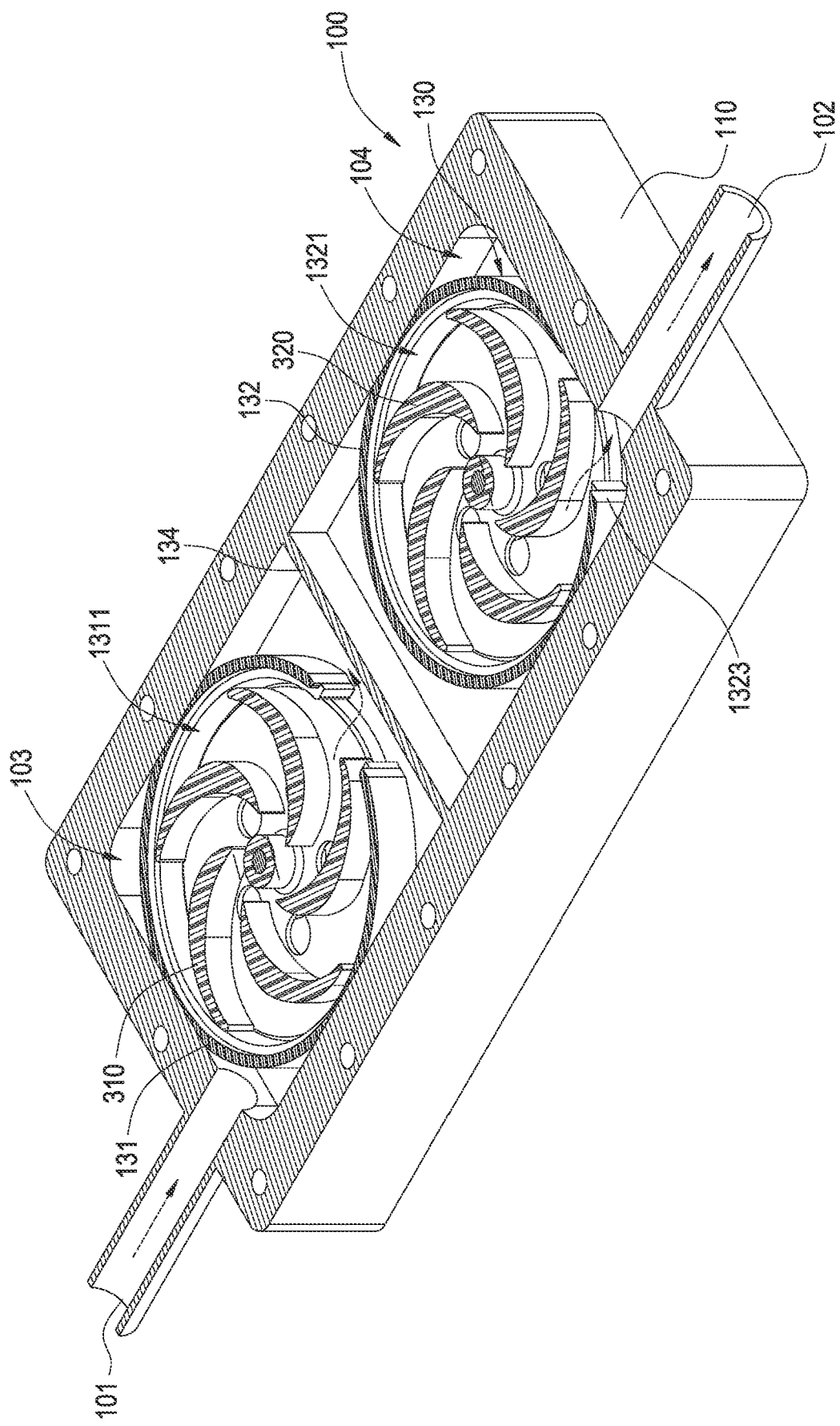
FIGS. 13 to 15 are schematic diagrams showing working status of the third embodiment of the present disclosure.
Figure 14:
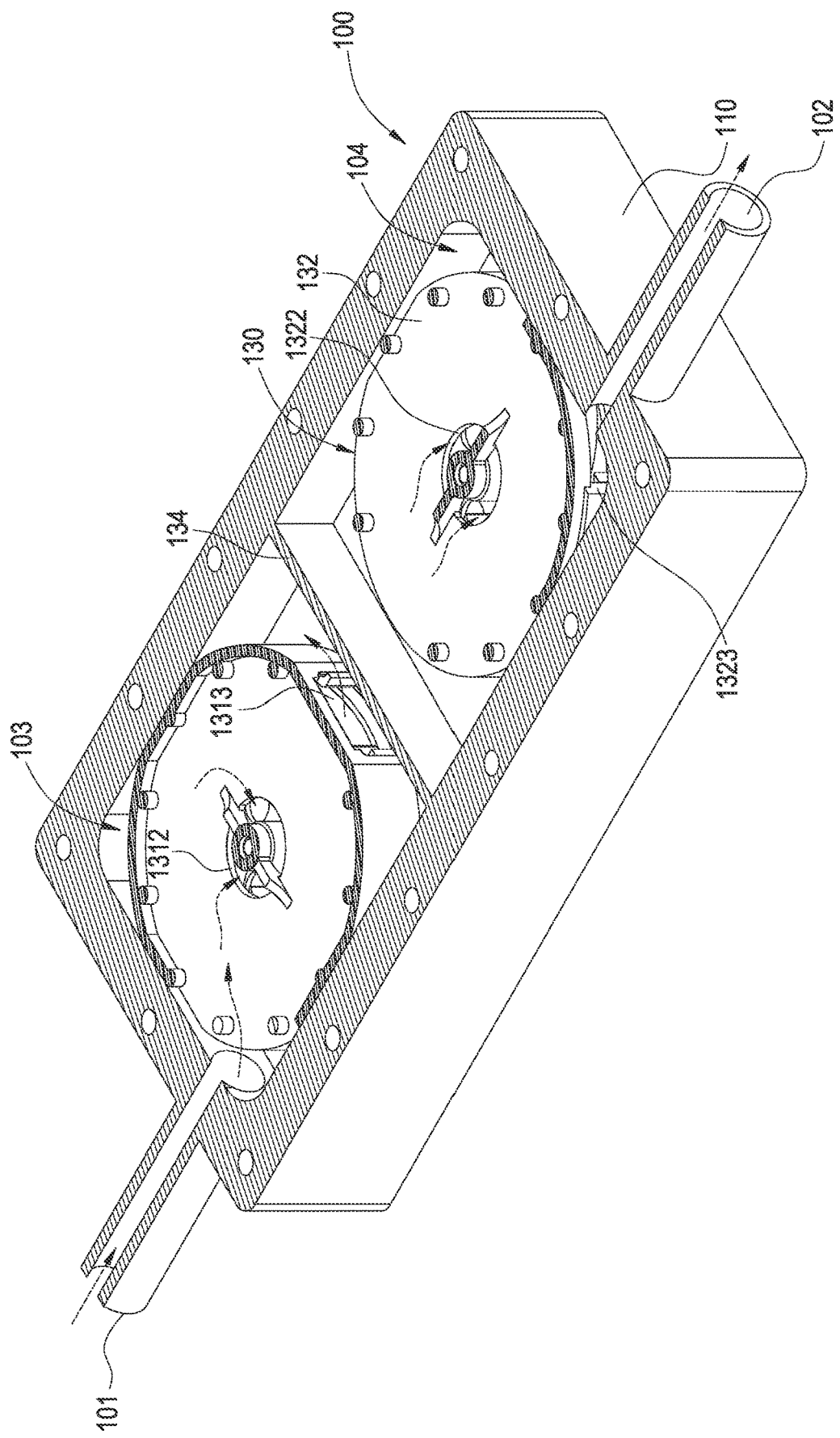
Figure 15:
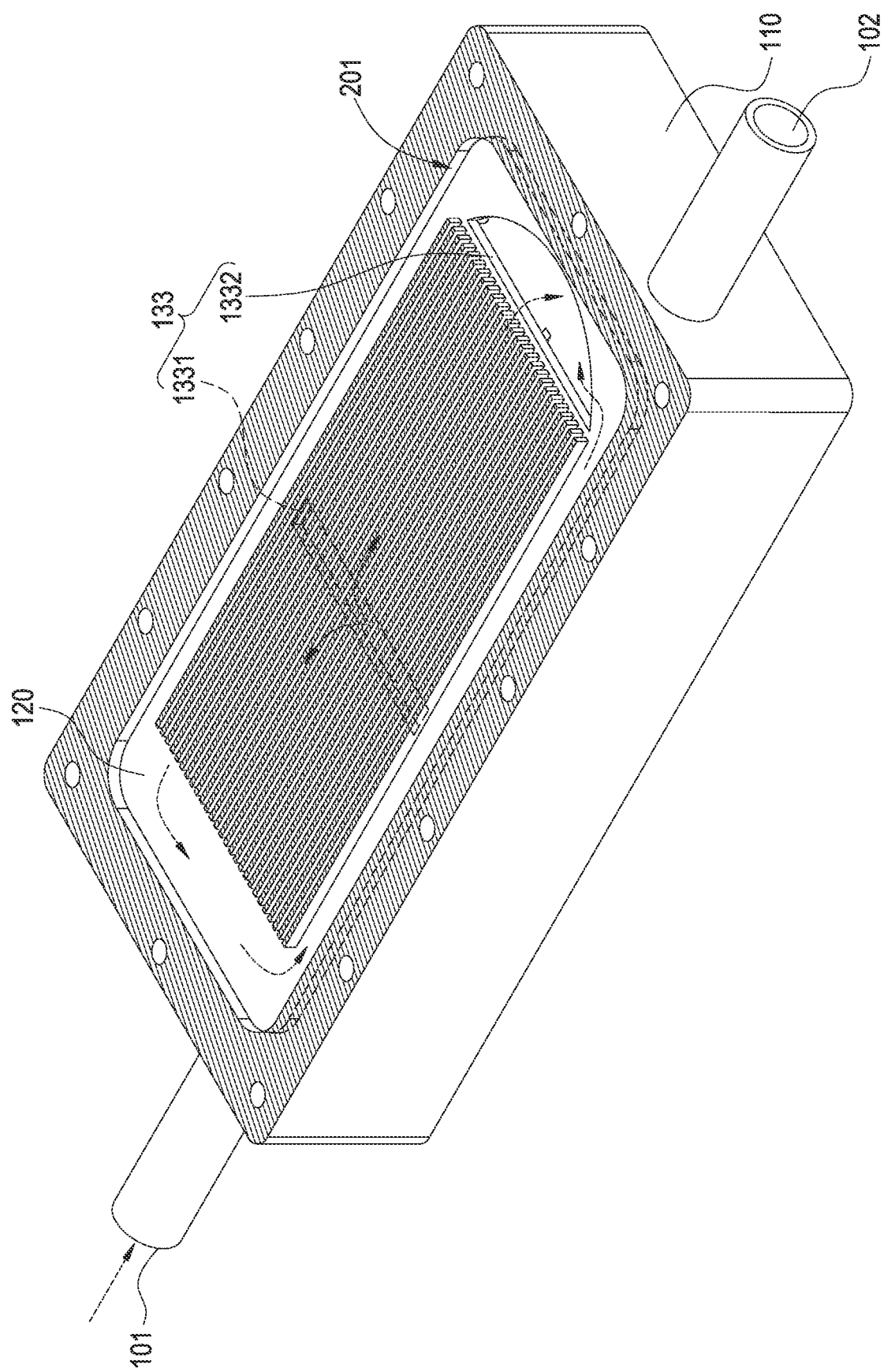

Referring to FIGS. 13 to 15, a pressure difference is caused between the first inlet opening 1312 and the first outlet opening 1313 while the first impeller 310 is rotating, and the working fluid is thereby driven to flow into the first rotor chamber 1311 through the first inlet opening 1312 and further flow out from the first rotor chamber 1311 through first outlet opening 1313. Then, the working fluid further flows into the connecting channel 133, and sequentially flows through the inlet segment 1331, the heat convection chamber 201 and the outlet segment 1332, and further flows into the second inlet opening 1322. A pressure difference is caused between the second inlet opening 1322 and the second outlet opening 1323 while the second impeller 320 is rotating, and the working fluid is thereby driven to flow into the second rotor chamber 1321 through the second inlet opening 1322, further flow out from the second rotor chamber 1321 through the second outlet opening 1323, and guided by the drainage tank 104 to flow out from the heat exchange module through the drainage hole 102. The heat conductive block 200 is used for contacting with a heat source and heat is thereby removed from the heat source, the working fluid in heat convection chamber 201 exchanges heat with the heat conductive block 200 and heat is thereby removed from the heat conductive block 200, and the heat is thereby removed from the heat exchange module while the working fluid through flows out from the heat exchange module through the drainage hole 102.

According to aforementioned serial configuration of the first impeller 310 and the second impeller 320, the working fluid is driven to flow by the first impeller 310, the working fluid is pressurized by the second impeller 320 to increase flowing head of the working fluid, and the first impeller 310 and the second impeller 320 are arranged coplanar with each other and serial connected via the connecting channel 133 to form a serial flowing field in the plane, such that thickness of the heat exchange module is thereby decreased, and space utilization thereof is increased while installing the serial pump.

Figure 16:
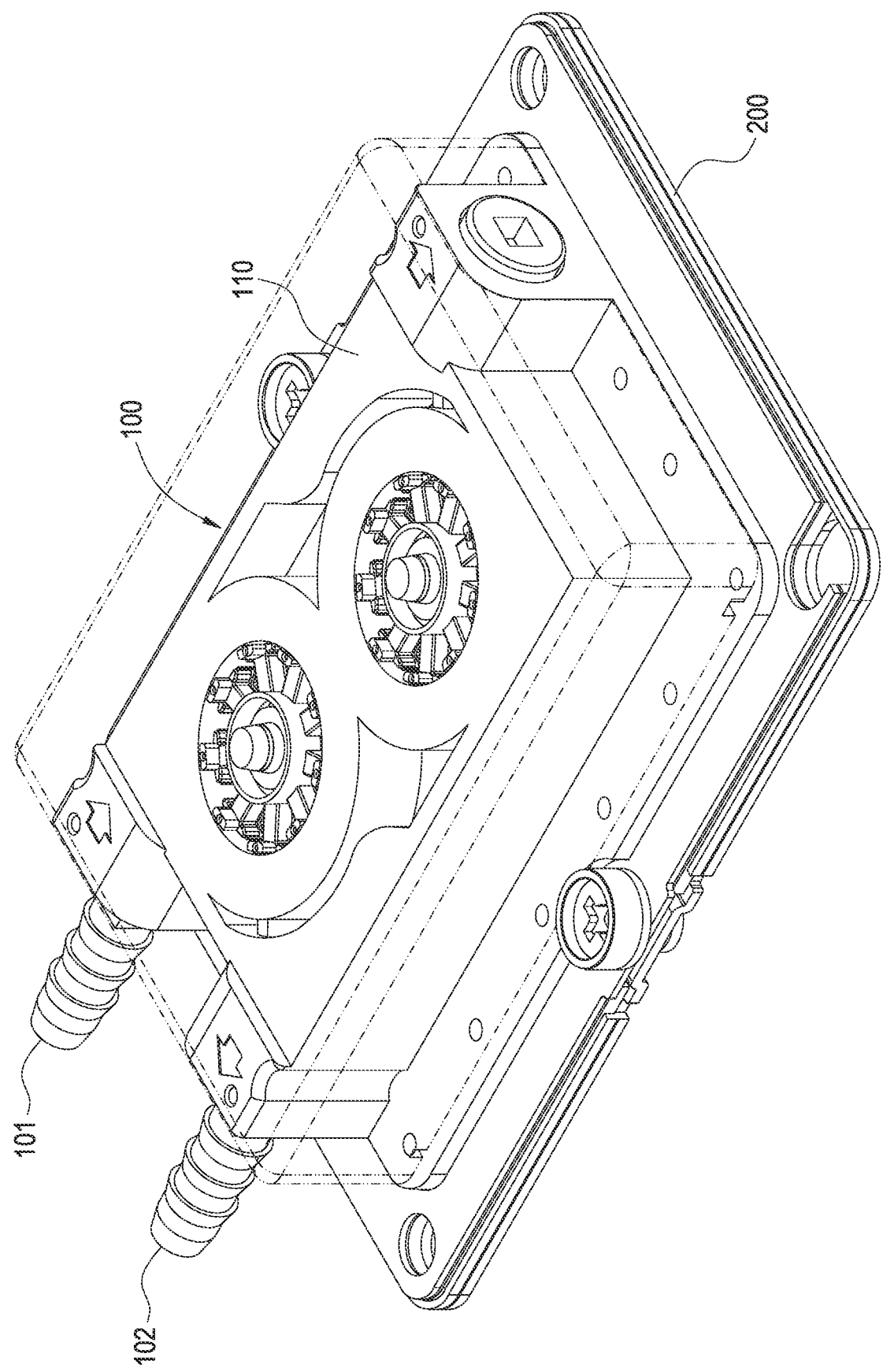
FIG. 16 is a perspective view showing the heat exchange module of a fourth embodiment of the present disclosure.
Figure 17:
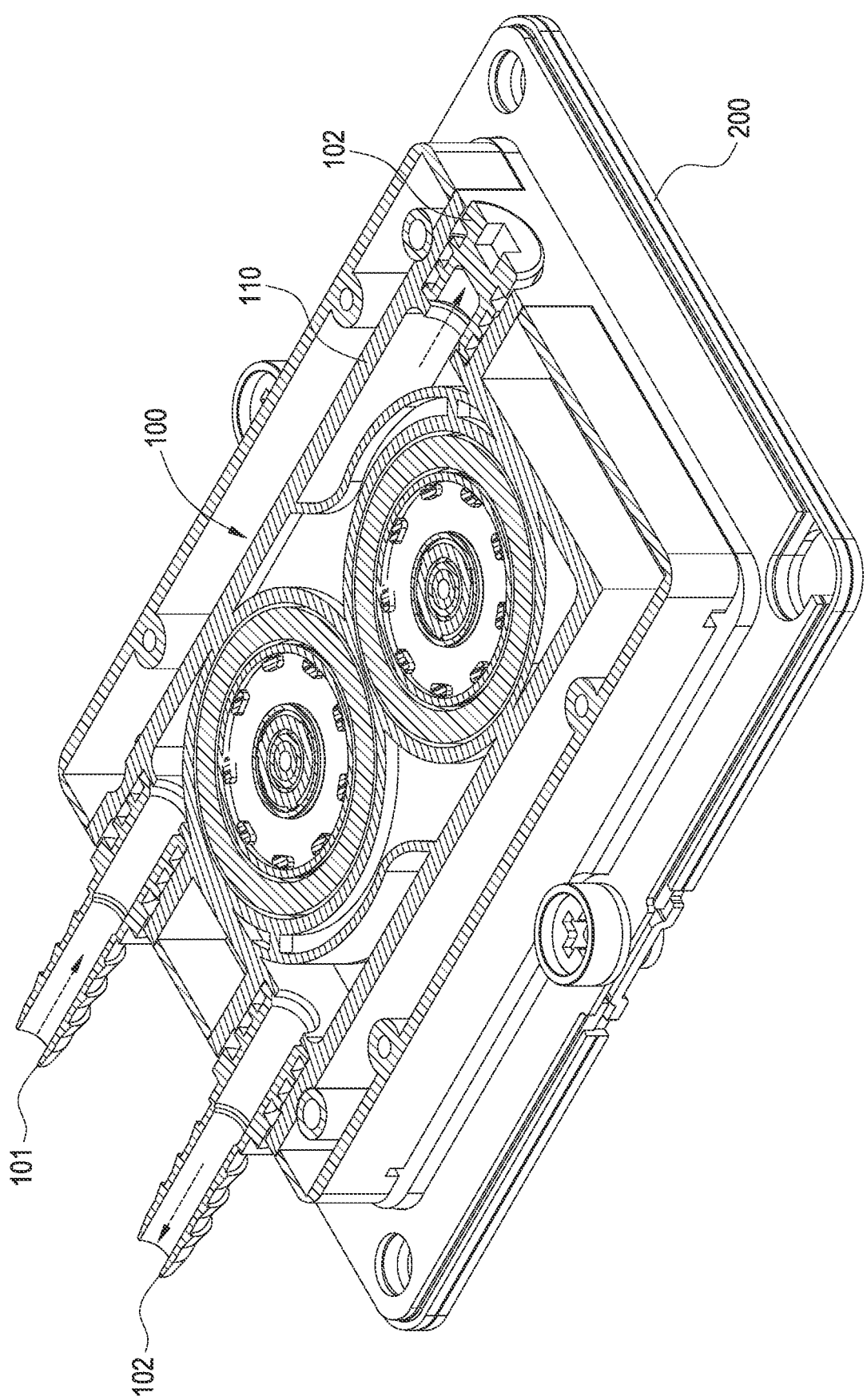
FIGS. 17 to 20 are schematic diagrams showing working status of the fourth embodiment of the present disclosure.
Figure 18:
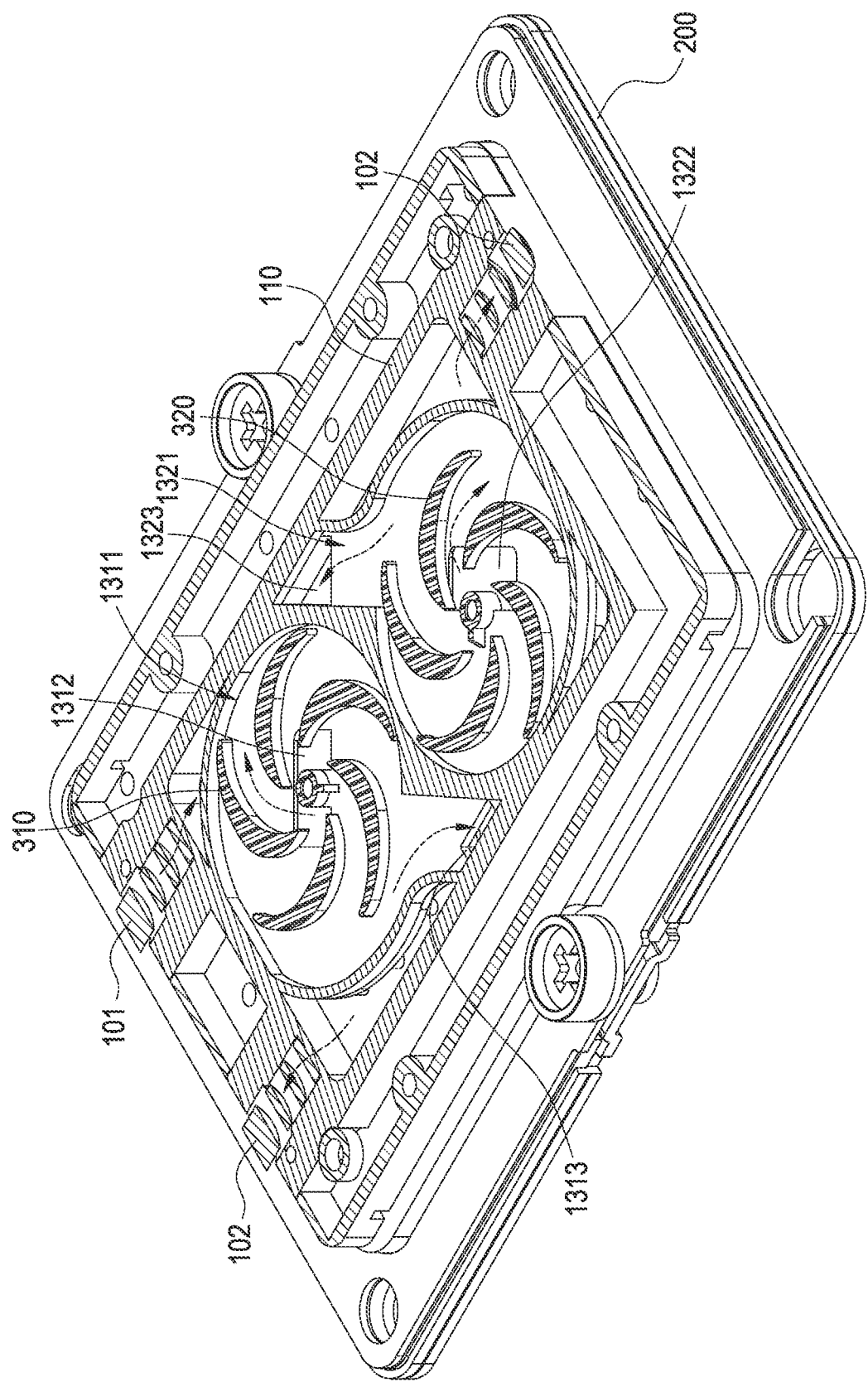
Figure 19:
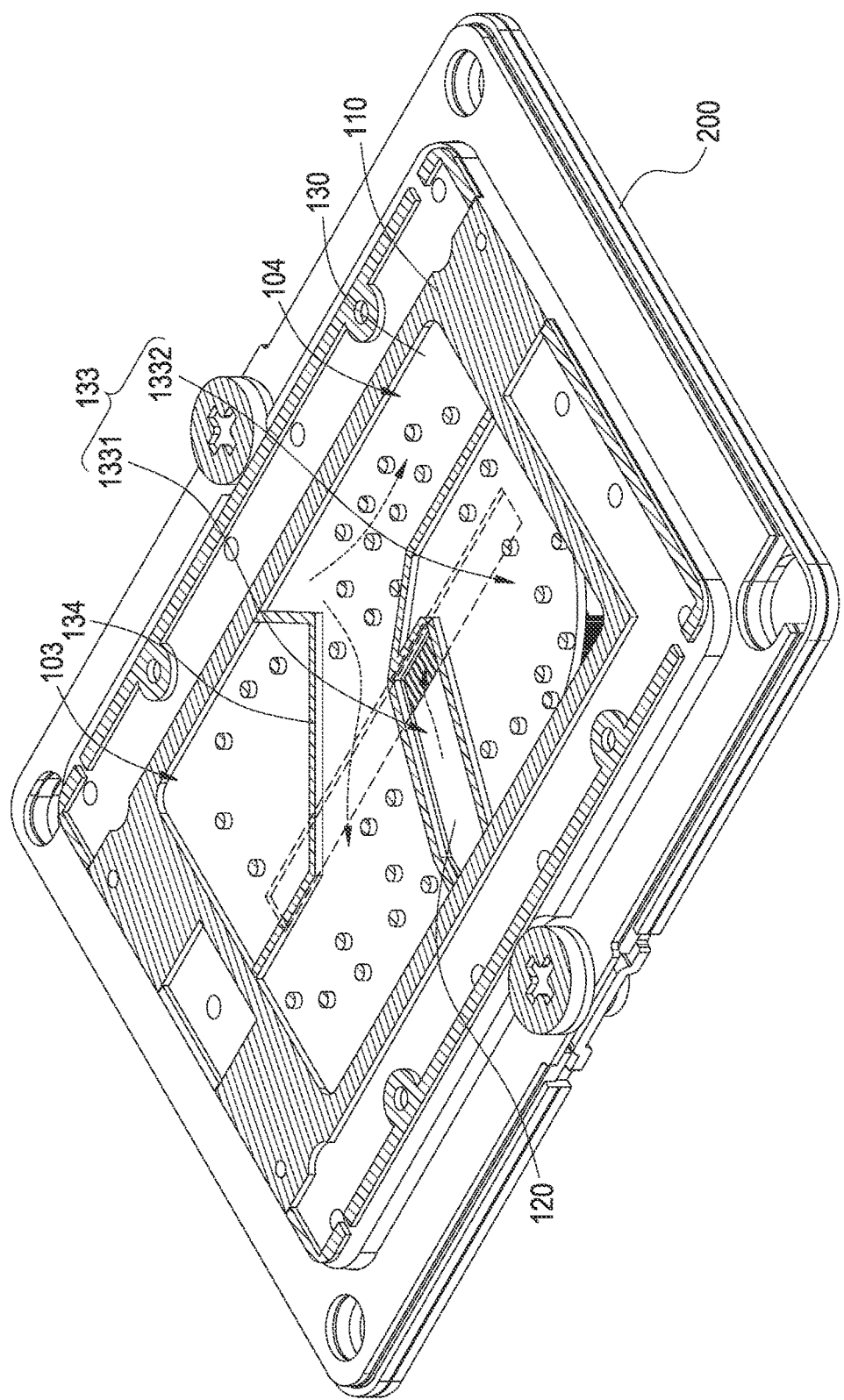
Figure 20:
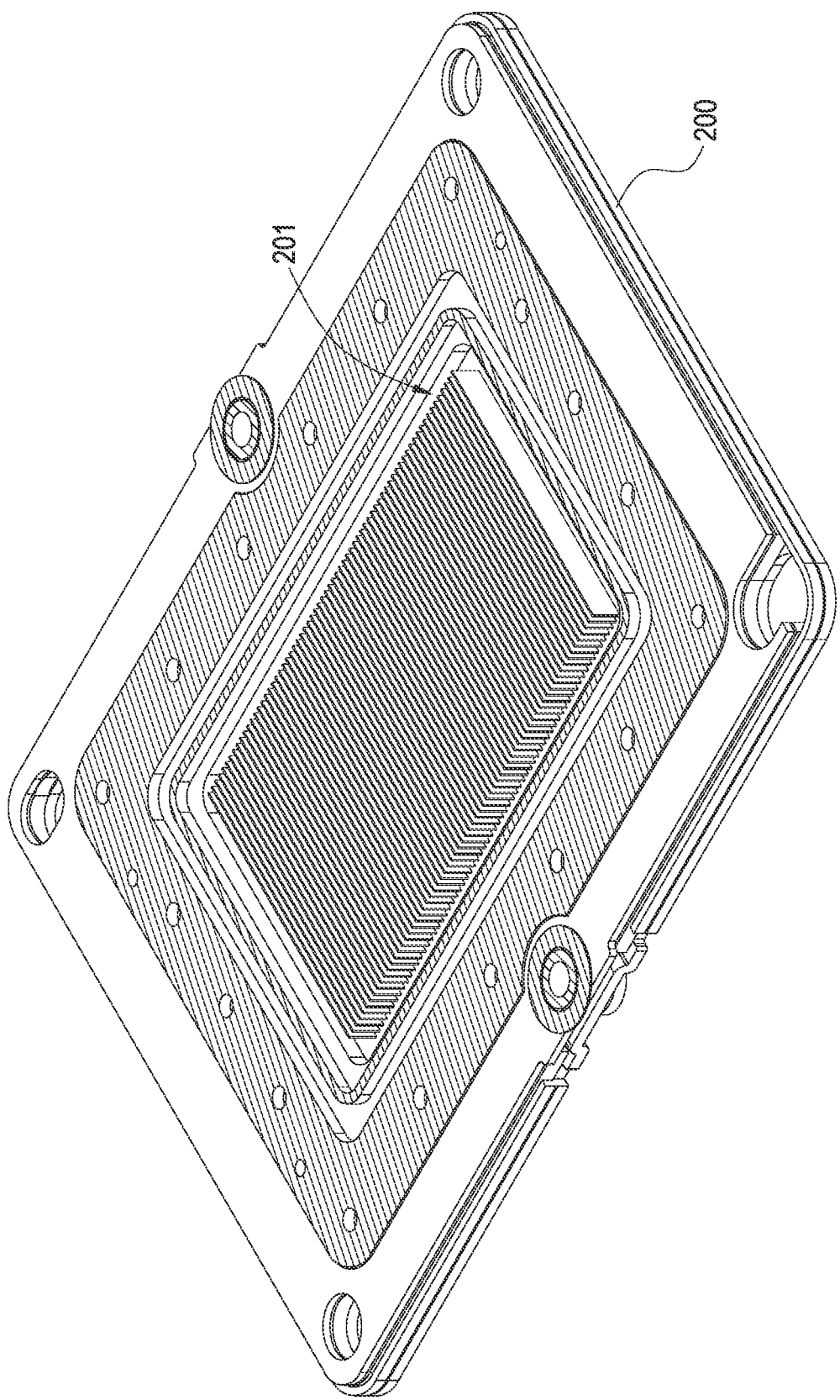

Referring to FIG. 16, a heat exchange module including a pump body 100, a heat conductive block 200, a first impeller 310 and a second impeller 320 is provided in the fourth embodiment of the present disclosure.

In the present embodiment, the pump body 100 preferably includes an upper cover 110, a base 120 and a partition plate 130.

The upper cover 110 and base 120 are sleeved with each other and thereby sealed with each other, a pumping hole 101 and a drainage hole 102 are defined on the upper cover 110, the partition plate 130 is stacked between the upper cover 110 and the base 120, the partition plate 130 includes at least a wall 134, the wall 134 divides the pump body 100 into a collection tank 103 and a drainage tank 104 isolated with from other, and the collection tank 103 is communicated with the pumping hole 101; a first rotor chamber 1311 and a second rotor chamber 1321 isolated with each other are formed in the upper cover 110, the first rotor chamber 1311 includes a first inlet opening 1312 and a first outlet opening 1313, the collection tank 103 and the first rotor chamber 1311 are communicated with each other via the first inlet opening 1312, the second rotor chamber 1321 includes a second inlet opening 1322 and a second outlet opening 1323, and the drainage tank 104 and the second rotor chamber 1321 are communicated with each other via the second outlet opening 1323; a connecting channel 133 is defined between the upper cover 110 and the base 120 by the wall 134 of the partition plate 130, the two ends of the connecting channel 133 are respectively communicated with the first outlet opening 1313 and the second inlet opening 1322, and the first rotor chamber 1311 and the second rotor chamber 1321 are communicated with each other via the connecting channel 133. In the present embodiment, two ends of the connecting channel 133 are respectively an inlet segment 1331 and an outlet segment 1332, the inlet segment 1331 is communicated with the first outlet opening 1313, the outlet segment 1332 is communicated with the second inlet opening 1322, and the first rotor chamber 1311 and the second rotor chamber 1321 are communicated with each other via the connecting channel 133.

A heat convection chamber 201 is defined between the heat conductive block 200 and the base 120, and the heat convection chamber 201 is communicated with the connecting channel 133. In the present embodiment, the heat convection chamber 201 is communicated between the inlet segment 1331 and the outlet segment 1332 of the connecting channel 133.

The first impeller 310 is pivotally arranged in the upper cover 110 and therefore located in the first rotor chamber 1311, a center of the first impeller 310 is arranged corresponding to the first inlet opening 1312, and a peripheral of the first impeller 310 is arranged corresponding to first outlet opening 1313.

The second impeller 320 is pivotally arranged in the upper cover 110 and therefore located in the second rotor chamber 1321, the second impeller 320 and the first impeller 310 are arranged coplanar with each other, a center of the second impeller 320 is arranged corresponding to the second inlet opening 1322, and a peripheral of the second impeller 320 is arranged corresponding to the second outlet opening 1323.

Referring to FIGS. 17 to 20, a pressure difference is caused between the first inlet opening 1312 and the first outlet opening 1313 while the first impeller 310 is rotating, and the working fluid is thereby driven to flow into the first rotor chamber 1311 through the first inlet opening 1312 and further flow out from the first rotor chamber 1311 through the first outlet opening 1313. Then, the working fluid further flows into the connecting channel 133 through the first outlet opening 1313, and the working fluid sequentially flows through inlet segment 1331, the heat convection chamber 201 and the outlet segment 1332, and further flows into the second inlet opening 1322. A pressure difference is caused between the second inlet opening 1322 and the second outlet opening 1323 while the second impeller 320 is rotating, and the working fluid is thereby driven to flow into the second rotor chamber 1321 through the second inlet opening 1322 and further flow out from the drainage tank 104 through the second outlet opening 1323 second rotor chamber 1321, and the working fluid is diverged by the drainage tank 104 and flows out from the heat exchange module through multiple drainage holes 102. The heat conductive block 200 is used for contacting a heat source and heat is thereby removed from the heat source, the working fluid in the heat convection chamber 201 exchanges heat with the heat conductive block 200 and heat is thereby removed from the heat conductive block 200, and heat is removed from the heat exchange module while the working fluid flows out from the heat exchange module through the drainage hole 102.

According to aforementioned serial configuration of the first impeller 310 and the second impeller 320, the working fluid is driven to flow by the first impeller 310, the working fluid is pressurized by the second impeller 320 and flowing head of the working fluid is thereby increased, and the first impeller 310 and the second impeller 320 are arranged coplanar with each other and serial connected via the connecting channel 133 to form a serial flowing field in the plane, such that thickness of the serial pump is thereby decreased, and space utilization thereof is increased while installing the serial pump.

While the heat exchange module of the present embodiment is working, the collection tank 103 is used for draining the working fluid into the heat exchange module through at least a pumping hole 101 and collecting therein for injecting into the first rotor chamber 1311, and the heat exchange module of the present disclosure could therefore be used for driving multiple working fluid loop arranged in parallel, but the scope of the present disclosure should not be limited by the embodiment. Rather than the collection tank 103 arranged in the pump body 100 and the corresponded first inlet opening 1312 of the first rotor chamber 1311, single pumping hole 101 communicated with the first rotor chamber 1311 for suppling working fluid to the first rotor chamber 1311 is defined in pump body 100 for single working fluid loop.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the present disclosure as defined in the appended claims.

What is claimed is:

1. A serial pump, comprising:
    a pump body including a first rotor chamber, a second rotor chamber and a connecting channel, wherein
        the first rotor chamber includes a first outlet opening,
        the second rotor chamber includes a second inlet opening, and
        the connecting channel fluidly communicates with the first outlet opening and the second inlet opening;
    a first impeller pivotally arranged in the first rotor chamber, an outer periphery of the first impeller being arranged corresponding to the first outlet opening;
    a second impeller pivotally arranged in the second rotor chamber, and a center of the second impeller being arranged corresponding to the second inlet opening; and
    a partition plate is arranged in the pump body, wherein the partition plate includes a first case and a second case that are arranged in the pump body, the first rotor chamber is defined by the first case, and the second rotor chamber is defined by the second case, wherein
        the first rotor chamber has a first inlet opening, and
        the partition plate at least partially defines a collection tank in the pump body, and the collection tank is in fluid communication with the first inlet opening.

2. The serial pump of claim 1, wherein a center of the first impeller is arranged corresponding to the first inlet opening.

3. The serial pump of claim 2, wherein the pump body includes a pumping hole in fluid communication with the collection tank.

4. The serial pump of claim 1, wherein the second rotor chamber includes a second outlet opening, and an outer periphery of the second impeller is arranged corresponding to the second outlet opening.

5. The serial pump of claim 4, wherein the partition plate at least partially defines a drainage tank in the pump body, and the drainage tank is in fluid communication with the second outlet opening.

6. The serial pump of claim 5, wherein the pump body includes a drainage hole in fluid communication with the drainage tank.

7. The serial pump of claim 1, wherein the second impeller and the first impeller are arranged coplanar with each other.

8. The serial pump of claim 1, wherein the partition plate includes a wall that divides the pump body into a collection tank and a drainage tank such that the collection tank and the drainage tank are fluidly separated from each other.

9. The serial pump of claim 8, wherein the partition plate at least partially defines the connecting channel in the pump body, and the first rotor chamber and the second rotor chamber are in fluid communication with each other via the connecting channel.

10. A pump, comprising:
    a cover positioned on a base, and a partition plate positioned between the cover and the base, wherein
        the partition plate includes a first case, a second case, and a connecting channel,
        a first rotor chamber is defined in the first case and includes a first inlet opening and a first outlet opening,
        a second rotor chamber is defined in the second case and includes a second inlet opening and a second outlet opening, and
        the first outlet opening and the second inlet opening are in fluid communication with each other via the connecting channel;
    a first impeller pivotally arranged in the first rotor chamber and configured to receive working fluid into the first rotor chamber via the first inlet opening and to expel working fluid from the first rotor chamber via the first outlet opening; and a second impeller pivotally arranged in the second rotor chamber and configured to receive working fluid into the second rotor chamber via the second inlet opening and to expel working fluid out of the second rotor chamber via the second outlet opening, wherein the first and second impellers are coplanar with each other, wherein a center of the first impeller is arranged corresponding to the first inlet opening, and a peripheral of the first impeller is arranged corresponding to the first outlet opening, and the cover, the base, and the partition plate at least partially define a collection tank, and wherein the collection tank is in fluid communication with the first rotor chamber via the first inlet opening.

11. The pump of claim 10, wherein a center of the second impeller is arranged corresponding to the second inlet opening, and a peripheral of the second impeller is arranged corresponding to the second outlet opening.

12. The pump of claim 10, wherein the cover, the base, and the partition plate at least partially define a drainage tank, wherein the drainage tank is in fluid communication with the second rotor chamber via the second outlet opening.

13. The pump of claim 12, wherein the partition plate further includes a wall that isolates the collection tank and the drainage tank from each other.

14. The pump of claim 12, wherein the cover includes a pumping hole in fluid communication with the collection tank.

15. The pump of claim 14, wherein the cover includes a drainage hole in fluid communication with the drainage tank.

16. The pump of claim 15, wherein the collection tank is in fluid communication with the pumping hole, and the drainage tank is in fluid communication with the drainage hole.

17. The pump of claim 10, wherein the first impeller and the second impeller are connected to each other in series.

* * * * *